United States Patent

[11] 3,617,827

[72] Inventors Albert Schmitz; Cornelis Mulder; Arie Slob, all of Emmasingel, Eindhoven, Netherlands

[21] Appl. No. 23,784
[22] Filed Mar. 30, 1970
[23] Division of Ser. No. 676,235, Oct. 18, 1967
[45] Patented Nov. 2, 1971
[32] Priority Oct. 21, 1965
[33] Netherlands
[31] 6,614,858

[54] SEMICONDUCTOR DEVICE WITH COMPLEMENTARY TRANSISTORS
3 Claims, 6 Drawing Figs.

[52] U.S. Cl. ........................................................ 317/235, 148/191, 317/235 D, 317/235 X
[51] Int. Cl. ........................................................ H01l 19/00
[50] Field of Search ............................................ 317/235 (22), 235 (22.1), 235 (41)

[56] References Cited
UNITED STATES PATENTS
3,449,643 6/1969 Imaizumi ........................ 317/235
OTHER REFERENCES
IBM Tech. Discl. Bul., " Producing Planar Four-Layer Components" by Muench Feb. 1967, page 1225

*Primary Examiner*—Jerry D. Craig
*Attorney*—Frank R. Trifari

ABSTRACT: A semiconductor device comprising complementary transistors is described. Both transistors are made in a single island and each include a buried layer. The PNP transistor uses the buried layer as collector, and the NPN transistor uses the buried layer to reduce collector resistance. The result is a fast-switching NPN transistor.

INVENTORS
ALBERT SCHMITZ
CORNELIS MULDER
ARIE SLOB

By [signature]
AGENT

INVENTORS.
ALBERT SCHMITZ
CORNELIS MULDER
ARIE SLOB

BY

Frank R. Trifari
AGENT

SEMICONDUCTOR DEVICE WITH COMPLEMENTARY TRANSISTORS

This application is a division of my copending application Ser. No. 676,235, filed Oct. 18, 1967.

This invention relates to a method of manufacturing a semiconductor device comprising a plurality of semiconductor circuit elements with a common semiconductor body, use being made of a starting semiconductor body of the one conductivity type, the substrate, in which a pattern of surface regions of one conductivity type adjacent a surface of the substrate and having a concentration of impurities causing one conductivity type which is considerably higher than that of the substrate is formed by diffusion of an impurity, and an epitaxial layer of the opposite conductivity type being formed on the said surface by deposition of semiconductor material, whereafter an impurity causing one conductivity type is diffused into surface portions of the epitaxial layer located above the pattern whereby at the same time diffusion from the pattern into the epitaxial layer occurs so that the impurity need be diffused into the epitaxial layer only over part of this thickness for the purpose of obtaining areas of the opposite conductivity type bounded in the epitaxial layer by diffused regions of one conductivity type, these areas, islands, extending approximately throughout the thickness of the epitaxial layer, a region of one conductivity type being formed in at least one island by diffusion of impurities and a region of the opposite conductivity type being formed in the said region for obtaining an NPN(PNP) transistor in which these regions constitute the base region and the emitter region, respectively, and the surrounding area of the island constitutes the collector region.

It is often desirable to manufacture not only an NPN(PNP) transistor but also a complementary PNP(NPN) transistor. Several methods are known therefore in the semiconductor technique.

A first method is to form a surface region of one conductivity type in an island, this surface region thus forming the emitter region of a PNP(NPN) transistor in which the surrounding area of the island constitutes the base region and the regions of one conductivity type bounding the island, to which the substrate also belongs, constitute the collector region. Then the emitter region is made, for example, equally thick as the base region of an NPN(PNP) transistor, the emitter and base regions can be formed simultaneously. The PNP(NPN) transistor can then be manufactured without an additional process step. However, an important disadvantage is that the base region of the PNP(NPN) transistor thus obtained is usually unduly thick, thus preventing satisfactory performance of the transistor. It is possible for the emitter region of the PNP(NPN) transistor to be diffused deeper in the island so that the base region becomes thinner, but in this case an additional process step is necessary while the deep diffusion is time consuming, difficult and poorly reproducible.

It has also been suggested to manufacture a lateral PNP(NPN) transistor, by forming in an island two surface regions of one conductivity type closely side by side. These surface regions serve as the emitter and the collector, respectively, while the base region can be thin by choosing a small distance between the surface regions. The regions may be formed simultaneously with the base region of an NPN(PNP) transistor. However, the geometry of an PNP(NPN) transistor thus obtained is very unfavorable and such transistors have, for example, a very low current-gain factor.

An object of the invention is to mitigate, at least considerably, the described disadvantages of known methods.

The present invention underlies recognition of the fact that a much better PNP(NPN) transistor can be obtained by using diffusion of an impurity from the substrate as well as from a surface of the epitaxial layer.

According to the invention, a method of the kind mentioned in the preamble is characterized in that a pattern is provided which includes a region above which an island is formed after the epitaxial layer has been applied, while during the diffusion of the impurity causing one conductivity type for obtaining the islands, the surface area of the epitaxial layer located above the said region of the pattern is masked against the diffusion, resulting in an island having a buried layer of one conductivity type which has been formed by diffusion from said region of the pattern, and that a surface region of one conductivity type is formed in this island above the buried layer of diffusion of an impurity for obtaining a PNP(NPN) transistor in which the said surface region is the emitter region and the surrounding area of the island is the base region, while the buried layer belongs to the collector region.

The base region of the NPN(PNP) transistor is preferably formed simultaneously with the emitter region of the PNP(NPN) transistor.

Since the buried layer belonging to the collector region of the PNP(NPN) transistor is obtained inter alia by diffusion of an impurity from the substrate into the epitaxial layer and the emitter region is formed by diffusion from the surface of the epitaxial layer, an intermediate thin base region may be obtained. It is not necessary to diffuse very deep so while for the manufacture of the PNP(NPN) transistor no additional process steps are necessary. Furthermore, the disadvantageous geometry above referred to, in which the emitter and collector regions are surface regions located side by side, is avoided.

Although the emitter region of the PNP(NPN) transistor may be formed after the diffusion treatment for obtaining the islands, it is preferable to interrupt the diffusion treatment for obtaining the islands and then to continue this treatment while forming simultaneously the emitter region of the PNP(NPN) transistor by diffusion of an impurity causing one conductivity type. The last-mentioned method provides a time gain and furthermore, for example, the thickness of the base region beneath the emitter region of the PNP(NPN) transistor can be adjusted more accurately and in a more reproducible manner since the formation of the emitter region does not affect the thickness of the buried layer of one conductivity type. If the emitter region is formed after the diffusion treatment for obtaining the islands, the thickness of the buried layer of one conductivity type, and hence the thickness of the base region beneath the emitter region, is determined only by the diffusion treatment for obtaining the islands, but also by the diffusion treatment for obtaining the emitter region and this may introduce inaccuracies.

The buried layer and the substrate have the same conductivity type and together form one region of one conductivity type. This implies that, when used in a circuit, the potential applied to the collector region of the PNP(NPN) transistor can only be the same as that applied to the substrate. This is not troublesome for several uses. However, for other uses it is desirable that the potential applied to the collector region of the PNP(NPN) transistor can be different from that applied to the substrate. In such cases, a second buried layer but of the opposite conductivity type may be provided which separates the buried layer of one conductivity type located in the epitaxial layer from the underlying part of one conductivity type belonging to the substrate, while above the buried layer of one conductivity type there is formed, in addition to the emitter region, a second surface region of one conductivity type, a contact region, which extends to the buried layer of one conductivity type. The buried layer of one conductivity type which belongs to the collector region is now separated from the substrate by regions of the other conductivity type and may thus have applied to it a potential other than that of the substrate. The contact region which extends to the buried layer of one conductivity type preferably surrounds the emitter region of one conductivity type so that the second buried layer of the opposite conductivity type is separated from the base region of the PNP(NPN) transistor. This makes possible to apply a potential to the buried layer of the opposite conductivity type which reduces the possibility of a parasitic transistor action between the collector region of the PNP(NPN) transistor and the substrate. The contact region is preferably formed during the diffusion treatment for obtaining the islands, so that the formation of the contact region does not require an additional process step.

Preferably a buried layer of the opposite conductivity type is provided for reducing the collector series-resistance of the NPN(PNP) transistor in a region adjacent the junction between the island in which the NPN(PNP) transistor is formed and the substrate. The buried layers of the opposite conductivity type which are formed for the PNP(NPN) transistor and the NPN(PNP) transistor are advantageously formed simultaneously so that additional process steps are avoided.

The method according to the invention thus makes it possible to manufacture both NPN(PNP) transistors and PNP(NPN) transistors having a buried layer belonging to the collector region and in which no additional process steps are necessary for manufacturing the PNP(NPN) transistor.

Use is preferably made of a P-type silicon substrate on which an N-type epitaxial silicon layer is formed, since with the present state of the semiconductor art this is advantageous from the technical view point, while final products are obtainable which are better and especially more stable than in the case where an N-type silicon substrate with a P-type epitaxial layer is used.

The invention also relates to a semiconductor device comprising a NPN(PNP) transistor and a PNP(NPN) transistor with a common semiconductor body as manufactured by the use of a method according to the invention.

In order that the invention may be readily carried into effect, it will now be described in detail, by way of example, with reference to the accompanying diagrammatic drawings, in which.

Figure 1:
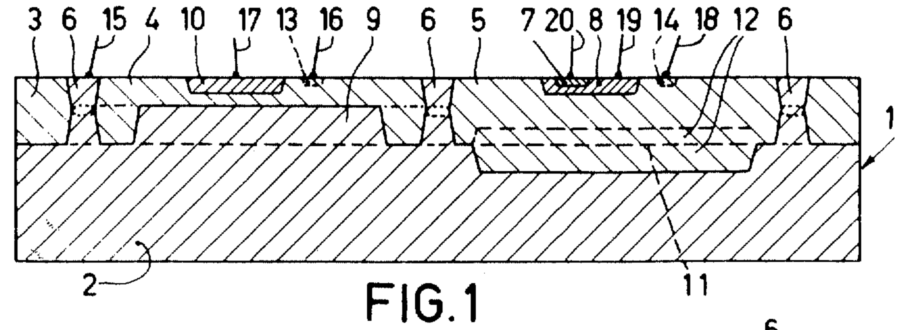
FIG. 1 is a cross-sectional view of a first embodiment of a semiconductor device according to the invention, taken on the line 1—1 of FIG. 2.
Figure 2:
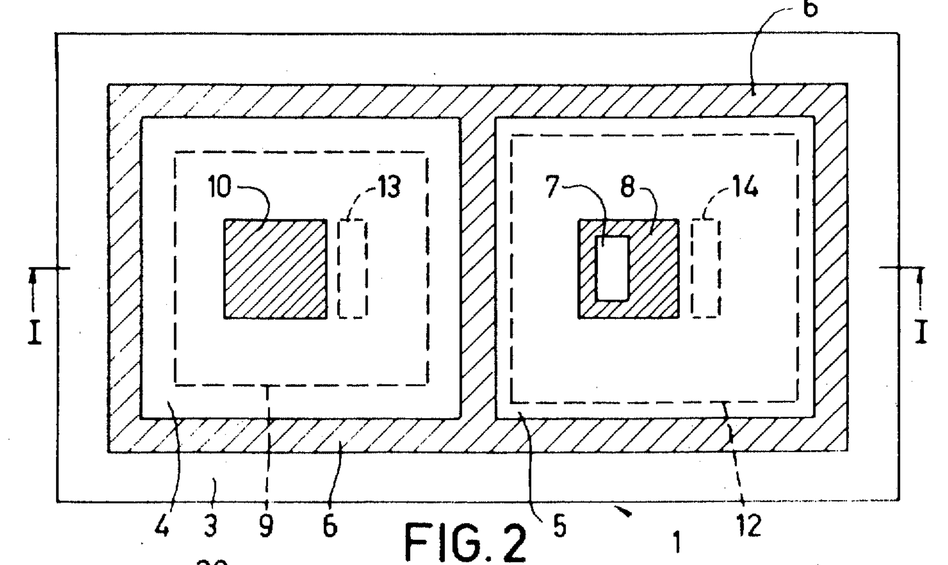
FIG. 2 is a plan view of this device.

FIGS. 1 and 2 show one embodiment of a semiconductor device according to the invention having a semiconductor body 1 comprising a substrate 2 with P-type conductivity and provided thereon an epitaxial layer 3 which includes a plurality of areas, islands, 4 and 5 of N-type conductivity which are bounded by regions 6 of P-type conductivity which adjoin the substrate 2. The island 5 comprises an NPN transistor in which the emitter region is formed by a diffused N-type surface region 7, the base region is formed by a diffused P-type region 8 surrounding the emitter region in the island 5, and the collector region is formed by N-type area of the island 5 surrounding the base region 8.

According to the invention, the island 4 includes a buried P-type layer 9, that is to say a layer 9 which lies deep in the island (that is to say a layer which lies deep in the expitaxial layer 3 and which can partly lie in the substrate 2) and which does not appear at the surface of the island 4. The buried layer 9 belongs to the collector region of a PNP-type transistor in which a diffused P-type surface region 10 formed above the buried layer 9 is the emitter region and in which the N-type area of the island 4 located between the region 10 and the layer 9, that is to say the area which does not belong to the region 10 and the layer 9, is the base region.

In the present embodiment, in order to reduce the collector series resistance of the NPN transistor, a buried N-type layer 12 is formed in a region adjacent the junction 11 between the island 5, in which the NPN transistor is formed, and the substrate 2. The buried layer 12 makes the collector region of the NPN transistor thicker and may also have a higher concentration of N-type impurities than the island 5.

N-type regions 13 and 14 which have a concentration of N-type impurities which is higher than that of the island 4 and 5 are formed to obtain good electrical connections. The electrical connection 15 to 20 are shown very diagrammatically in FIG. 1 only, lest the FIGS. are made unnecessarily complicated. For the same reasons the insulating layer, for example of silicon oxide or silicon nitride, which is usually present and applied to the surface of the epitaxial layer 3 is omitted in the FIGS. Such an insulating layer has apertures through which the electrical connections 15 to 20 are made to the semiconductor body 1, the electrical connections usually extending over the insulating layer in the form of metal tracks. With the insulating layer present, the junction formed by the surface diffused regions extend to the surface under the insulating layer as is common in the well-known planar process.

The semiconductor device of FIGS. 1 and 2 comprising an NPN transistor and a PNP transistor and a common semiconductor body 1 may be manufactured by a method according to the invention as follows:

Use is made of a P-type substrate 2 approximately 250$\mu$ thick having a resistivity of approximately 5 ohm-cm. The further dimensions are unimportant and must merely be large enough to permit the formation of two islands of the dimensions specified hereinafter.

A pattern 22 (see also FIGS. 3 and 4) adjacent to a surface 21 is formed in the substrate 2 by diffusion of boron (P-type). The pattern 22 comprises P-type surface regions having a concentration of P-type impurities which is materially greater, that is to say 10 times greater and in practice from 100 to 1,000 times greater, than that of the substrate 2.

Figure 3:
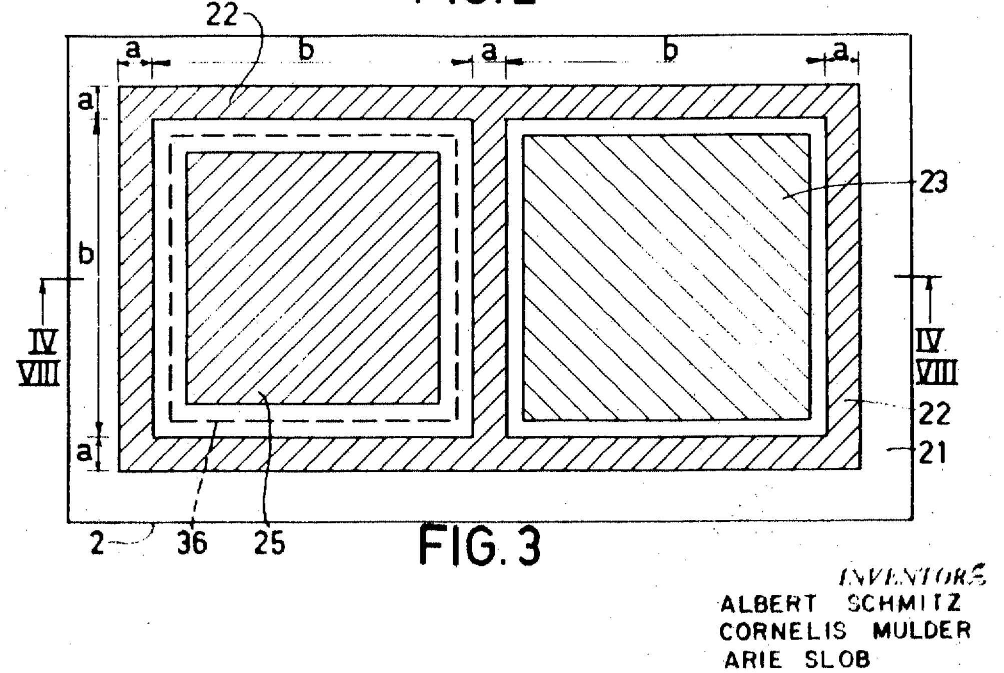
FIG. 3 and 4 are plan and cross-sectional view of a stage illustrating the manufacture of a device according to the invention.

The boron may be diffused in a conventional manner using, for example, a silicon-oxide layer provided with apertures as a diffusion mask. The surface concentration of boron in the pattern 22 is approximately $5\times10^{19}$ boron atoms/cc. and the pattern 22 is between approximately 0.5$\mu$ and 1$\mu$ thick. The dimensions *a* and *b* indicated in FIG. 3 are approximately 25$\mu$ and 200$\mu$ respectively.

To decrease the collector series-resistance of the NPN-type transistor (see figs. 1 and 2) it is necessary to form an N-type buried layer 12 in a region adjacent the junction 11 between the island 5, in which the NPN transistor is manufactured, and the substrate 2. To this end, an N-type surface region 23 is formed, in addition to the pattern 22, in the substrate 2 (see FIGS. 3 and 4). The surface region 23 has dimensions of, for example, $150\mu\times150\mu\times5\mu$ and may be obtained by diffusion arsenic (N-type) into the substrate 2 in a conventional manner. The surface concentration of the arsenic is approximately $21\times10^{20}$ arsenic atoms/ccm. During the diffusion of the arsenic the boron diffuses deeper into the substrate 2, so that the pattern 22 becomes thicker and even thicker than the region 23.

Subsequently the surface 21 of the substrate 2 is covered with an epitaxial N-type layer 3, (see also FIGS. 1 and 2) having a thickness of approximately 10$\mu$ and a resistivity of approximately 0.3 Ω-cm. This may be carried out in a conventional manner, for example, by depositing silicon from a gaseous compound.

Boron (P-type) is diffused into surface areas of the epitaxial layer 3 located above the pattern 22. During the process boron is also diffused from the pattern 22 into the epitaxial layer 3. Consequently the boron need be diffused into the epitaxial layer over only half its thickness, approximately 5$\mu$, to obtain the N-type islands 4 and 5 which are bounded by the P-type regions 6 obtained by the diffusion of boron. The islands 4 and 5 extend substantially over half the thickness of the epitaxial layer 3. The diffusion of boron may be effected in a conventional manner.

During the diffusion of the boron, arsenic is also diffused from the zone 23. The arsenic penetrates the epitaxial layer 3 over a depth of approximately 1.5$\mu$, resulting in the N-type buried layer 12 being obtained.

The P-type region 8 having dimensions of approximately $40\mu\times40\mu\times2\mu$ and a surface concentration between approximately $10^{18}$ and $10^{19}$ boron atoms/ccm. is formed in the island 5 by diffusion of boron. The N-type region 7 is formed in the region 8 by diffusion of phosphorus. The region 7 has dimensions of approximately $15\mu\times30\mu\times1\mu$ and a surface concentration higher than $10^{20}$ phosphorus atoms/ccm. The diffusions of boron and phosphorus may be effected in a conventional manner. The region 7 is the emitter region, the region 8 is the base region and the adjacent area of the island 5 including the buried layer 12 is the collector region of the NPN transistor.

According to the invention a PNP transistor having a buried P-type layer 9 is also formed.

To this end, a pattern 22, 25 is provided in the substrate 2 (See FIGS. 3 and 4) having an area 25 of approximately )00$\mu\times100\mu\times0.5\mu$ to $1\mu$, above which the island 4 is formed following the formation of the epitaxial layer 3, while the surface area of the epitaxial layer 3 located above the area 25 of the pattern 22, 25 is masked during the diffusion of boron for obtaining the regions 6 and hence the islands 4 and 5, resulting in the island 4 being obtained with a P-type buried layer 9 which has been formed by diffusion of boron from the area 25. Subsequently the P-type surface region 10 is formed in the island 4 above the buried layer 9. This may be effected at the same time as the region 8 is formed, the regions 10 and 8 may having the same dimensions. The P-type region 10 is the emitter region of the PNP transistor, the surrounding N-type area of the island 4 is the base region, while the P-type buried layer 9 constitutes the collector region. Although as previously described, the P-type emitter region 10 and the P-type base region 8 may be formed after the diffusion treatment for obtaining the islands 4 and 5, and hence the regions 6, it is preferable to interrupt the diffusion treatment for obtaining the islands 4 and 5 and then to continue this treatment while forming at the same time the emitter region 10 and the base region 8 by diffusion of a P-type impurity.

A diffusion treatment for obtaining islands in an epitaxial layer is carried out with the use of a diffusion mask provided on the epitaxial layer. The diffusion mask often consists of an apertured silicon-oxide layer (or silicon nitride layer), an impurity being diffused through the apertures into the epitaxial layer.

In the described method according to the invention, as apertured mask may be provided on the epitaxial layer 3 in a conventional manner, boron being diffused through the apertures in the epitaxial layer 3 to obtain the regions 6. To this end, the boron is previously provided in the apertures, for example, in the form of boron oxide. It is now possible to interrupt the diffusion treatment before the regions 6 resulting also from diffusion from the pattern 22 have been formed completely and to form apertures in the diffusion mask for forming the regions 8 and 10. After boron oxide has been provided in these apertures as well, the diffusion treatment is continued whereby the regions 6 acquire their ultimate shape and at the same time the regions 8 and 10 are obtained.

The advantage then occurs that the thickness of the buried layer 9 does not depend upon the diffusion treatment for obtaining the regions 8 and 10, as is the case if the regions 8 and 10 are formed after the diffusion treatment for obtaining the islands 4 and 5 and the regions 6. An unduly great thickness of the buried layer 9 can thus be prevented and the thickness of the base region between the emitter region 10 and the buried layer 9 can be adjusted more accurately.

The area 25 is formed in a similar manner as the regions 22. The buried layer 9 penetrates the epitaxial layer 3 over a depth of approximately $5\mu$ (half the thickness of the epitaxial layer 3).

The diffusion from the pattern 22, 25 into the substrate 2 is now shown since this diffusion is not interesting for the operation nor for the device to be obtained.

The regions 6 consist of regions which overlap one another. This overlapping is indicated in broken lines in the regions 6.

The N-type regions 13 and 14 can be formed at the same time and in a similar manner as the emitter region 7 and have dimensions of approximately $10\mu\times40\mu\times1\mu$.

The electrical connections 15 to 20 may be made in a conventional manner. The lower side of the substrate 2 may also be provided with an electrical connection which may serve as a collector collection of the PNP transistor. The connection 15 may then be dispensed with.

The electrical connection 15, 16 and 17 and 18, 19, 20 form the collector, base and emitter connections of the PNP transistor and the NPN transistor respectively.

The buried P-type layer 9 may have a larger surface area and adjoin the regions 6 locally or round about. The last-mentioned possibility is indicated by dot-and-dash lines in FIG. 1.

Since the buried layer 9 belonging to the collector region is obtained by diffusion from the substrate 2 and the emitter region 10 is obtained by diffusion from the surface of the epitaxial layer 3, a thin base region for the PNP transistor is possible while avoiding very deep diffusion and furthermore for obtaining the PNP transistor no additional process steps are necessary relative to the NPN transistor.

Figure 4:
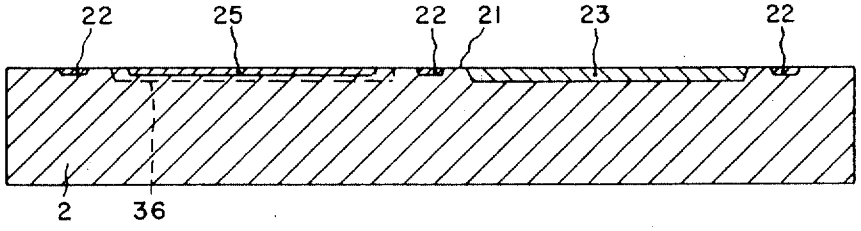

FIGS. 3 and 4 also illustrate how to obtain a semiconductor device according to the invention of a similar kind to that of the previous figures, but in which the P-type buried layer 9 is separated from the underlying P-type area belonging to the substrate 2, by means of a second buried N-type layer 36. To this end, it is necessary to provide a pattern 22, 25 (see also FIGS. 3 and 4) in which the area 25 is separated from the remaining part 22 of the pattern. Further, prior to the formation of the epitaxial layer 3, arsenic (N-type) is diffused into a surface region 36. When viewed on the surface 21 of the substrate 2 (see FIG. 3) the region 36 overlaps the area 25 on all sides. The regions 36 and 23 may be formed simultaneously and in the same manner and may have the same dimensions. The concentration of arsenic in the regions 36 and 23 is greater than that of the impurity which causes P-type conductivity in the substrate 2. Arsenic diffuses into silicon more slowly than boron with which the pattern 22, 25 has been formed, while the concentration of arsenic in the overlapping region 36 is high enough, after the formation of the epitaxial layer 3 and after the diffusion treatment for obtaining the islands, to form a second buried N-type layer which includes the overlapping surface region 36 and which separates the buried P-type layer 9 located in the epitaxial layer 3, from the underlying P-type area which belongs to the substrate 2.

Figure 5:
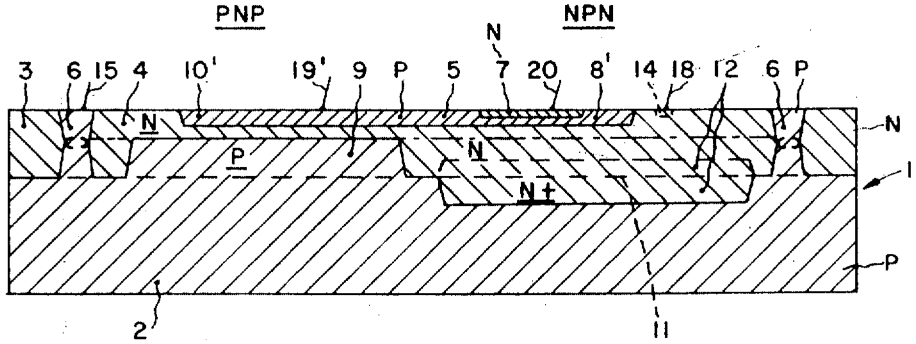
FIG. 5 is a cross-sectional view of another embodiment according to the invention taken along the line 5—5 of FIG. 6.
Figure 6:
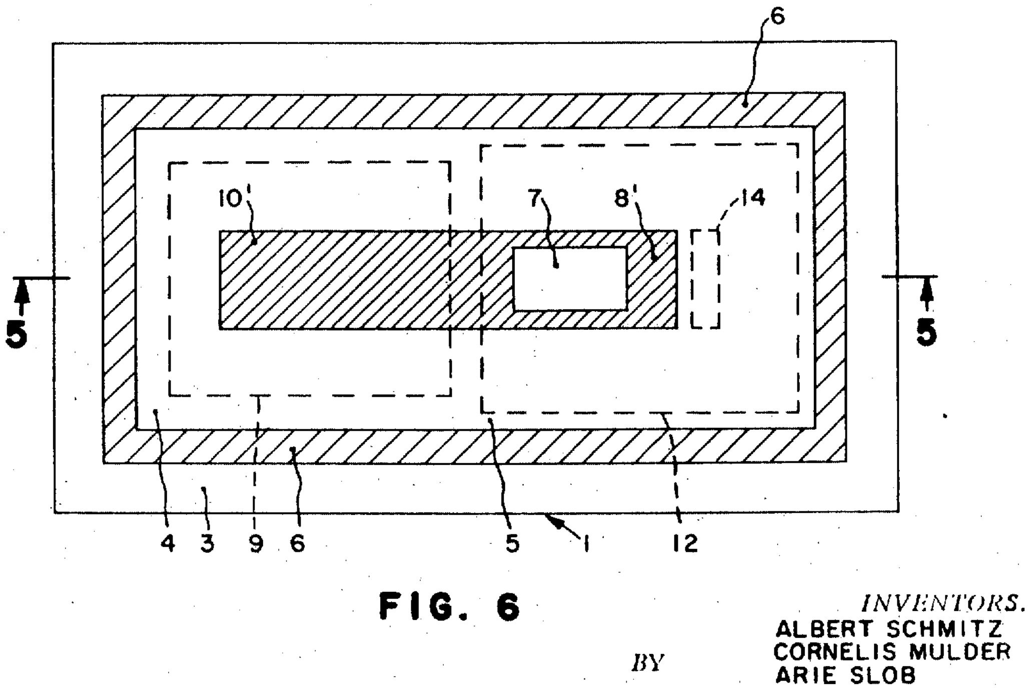
FIG. 6 is a plan view of the device shown in FIG. 3. Similar parts are indicated in the FIGS. by the same reference numerals.

Furthermore, a NPN transistor and a PNP transistor according to the invention may be combined in one island. This is illustrated in FIGS. 5 and 6, in which the base zone 8′ of the NPN transistor now also constitutes the emitter zone 10′ of a parasitic PNP transistor. Where the base zone 8′ and emitter zone 10′ are united, the $n+$ buried layer 12 is reduced to about half its size to only lie beneath about the half of the combined zone 8′–10′ in which the emitter zone 7 of the NPN transistor is provided, and the p buried layer 9 is also reduced to about half its size and lies beside the buried layer 12 beneath the other half of the base zone 8′–10′. Preferably the collector connection 14, 18 and the base connection 19′ of the NPN transistor lie above the buried layers 12 and 9 respectively. Connections to the substrate 2 may be made directly or via the connection 15. The result is an NPN transistor with an improved parasitic PNP transistor which increases the switching speed of the NPN transistor by reducing the storage time.

It will be evident that, although embodiments have been described in which only one PNP transistor and only one NPN transistor are formed in a semiconductor body, it is possible to manufacture a plurality of NPN transistors and/or a plurality of PNP transistors in a semiconductor body and furthermore several other circuit element, such as diodes, capacitors and resistors.

Thus it is possible, for example, to form more than one semiconductor circuit element in an island. Further, the islands 4 and 5 of FIGS. 1,2, 3 and 4 need not have a common boundary region 6. The two islands can be surrounded in the epitaxial layer by separate boundary regions 6. Further, a large number of semiconductor devices according to the invention can be manufactured simultaneously in one semiconductor disc which, after using a method according to the invention, may be subdivided into individual semiconductor devices. It is also possible to use semiconductor materials and/or impurities other than those described. The emitter region 10 and the base region 8 need not be formed simultaneously through this is preferred. If, for example, an impurity concentration greater for region 10 than for region 8 is desired, these regions may be manufactured one after the other.

The use of NPN transistors together with PNP transistors is integrated semiconductor circuits has hitherto been avoided in the semiconductor technique as far as possible, since it was very difficult to manufacture both types of transistors with good quality in one semiconductor body. The invention makes it possible in a simple manner to manufacture both types of transistors in a semiconductor body with reasonable qualities, thus considerably widening the possibilities for use of integrated semiconductor circuits.

It will be evident that the invention is not confined to the embodiments described and that numerous variations are possible to a man skilled in the art without passing beyond the scope of the invention.

What is claimed:

1. A transistor device comprising in combination:

a. a substrate of one conductivity type;

b. an epitaxial layer of said opposite conductivity type extending over substantially the entire area of said one surface of said substrate;

c. at least one diffused ring of said one conductivity type extending through said epitaxial layer to said one surface of said substrate so as to form at least one island in said epitaxial layer contiguous with said substrate;

d. a first transistor formed within said one island, said first transistor including;

1. a diffused base region of said one conductivity type formed within said first island,
2. a diffused emitter region of said opposite conductivity type formed within said base region, wherein,
3. the epitaxial layer isolated within said first island forms the collector region of said first transistor;

e. a second transistor formed within said same one island, said second transistor including:

1. a diffused emitter region of said one conductivity type formed within said one island and connected to the diffused base region of said first transistor and having the same depth and same impurity distribution, wherein
2. the epitaxial layer isolated within said one island forms the base region of said second transistor;

f. a first buried diffused region of said one conductivity type formed within a region of said one island adjacent the substrate with said buried region being contiguous with the substrate, said first buried region underlying its respective base and emitter regions and forming the collector region of said second transistor;

g. and a second buried diffused region of said opposite conductivity type wholly lying beside the first buried region in adjacent areas of the substrate and said one island, said second buried region underlying its respective base and emitter regions and providing a low-resistivity path for collector current in said first transistor.

2. A transistor device as set forth in claim 1 wherein the diffused emitter region of the second transistor and the diffused base region of the first transistor are contiguous and continuous with one another.

3. A transistor as set forth in claim 2 wherein the first transistor is a NPN transistor and the second transistor is a PNP transistor.

* * * * *